(12) United States Patent
Wada et al.

(10) Patent No.: US 11,074,761 B2
(45) Date of Patent: Jul. 27, 2021

(54) ASSISTANCE DEVICE, DESIGN ASSISTANCE SYSTEM, SERVER, AND DESIGN ASSISTANCE METHOD

(71) Applicant: MISUMI CORPORATION, Tokyo (JP)

(72) Inventors: Takaaki Wada, Tokyo (JP); Mitsunobu Yoshida, Tokyo (JP); Kenji Nakagawa, Tokyo (JP); Atsushi Shibata, Tokyo (JP)

(73) Assignee: MISUMI CORPORATION, Tokyo (JP)

( * ) Notice: Subject to any disclaimer, the term of this patent is extended or adjusted under 35 U.S.C. 154(b) by 0 days.

(21) Appl. No.: 16/323,995

(22) PCT Filed: Jul. 14, 2017

(86) PCT No.: PCT/JP2017/025711
§ 371 (c)(1),
(2) Date: Feb. 7, 2019

(87) PCT Pub. No.: WO2018/030073
PCT Pub. Date: Feb. 15, 2018

(65) Prior Publication Data
US 2019/0213799 A1 Jul. 11, 2019

(30) Foreign Application Priority Data
Aug. 9, 2016 (JP) .............................. JP2016-157027

(51) Int. Cl.
G06T 19/20 (2011.01)
G06F 30/00 (2020.01)
G06T 11/00 (2006.01)

(52) U.S. Cl.
CPC .............. *G06T 19/20* (2013.01); *G06F 30/00* (2020.01); *G06T 11/00* (2013.01); *G06T 2219/012* (2013.01)

(58) Field of Classification Search
CPC .... G06F 30/00; G06F 3/04815; G06F 16/444; G06F 2111/20; G06T 15/00; G06T 19/00;
(Continued)

(56) References Cited

U.S. PATENT DOCUMENTS 8,462,153 B2 * 6/2013 Repin .................... G06T 19/00
345/420
2001/0018644 A1 8/2001 Uchikura et al.
(Continued)

FOREIGN PATENT DOCUMENTS

JP 11-316775 A 11/1999
JP 2002-324086 A 11/2002
(Continued)

OTHER PUBLICATIONS

International Search Report dated Sep. 19, 2017 for the corresponding PCT International Patent Application No. PCT/JP2017/025711.
(Continued)

*Primary Examiner* — Diane M Wills
(74) *Attorney, Agent, or Firm* — Leason Ellis LLP

(57) ABSTRACT

Provided are a design assistance device, a design assistance system, a server, and a design assistance method that can display shapes and specification information of a plurality of items included in an item group so that a user can easily view the items. The design assistance device includes: a three-dimensional data acquisition unit that acquires three-dimensional data of an item group including a plurality of items; a display data generation unit that generates two-dimensional display data including a two-dimensional display representing an appearance of the item group and specifi-
(Continued)

cation information of at least one of the items in one observation direction in the three-dimensional data; and a display mode determination unit that determines a display mode of the specification information in the two-dimensional display based on a shape of each of the items as well as relative positions and relative orientations between the items as viewed in the one observation direction.

17 Claims, 11 Drawing Sheets

(58) Field of Classification Search
CPC ............... G06T 19/20; G06T 2219/00; G06T 2219/004; G06T 2219/008; G06T 2219/012; G06T 2219/20; G06T 2219/2004; G06T 2219/2008; G06T 2219/2012; G06T 2219/2016; G06T 2219/2021; G06T 2219/2024; G06Q 50/04
See application file for complete search history.

(56) References Cited

U.S. PATENT DOCUMENTS

| | | | |
|---|---|---|---|
| 2002/0118187 A1* | 8/2002 | Batori | G06T 19/00 345/419 |
| 2002/0118229 A1 | 8/2002 | Batori et al. | |
| 2002/0149625 A1 | 10/2002 | Shimizu et al. | |
| 2003/0204279 A1* | 10/2003 | Yokohari | G05B 19/4097 700/98 |
| 2005/0225551 A1 | 10/2005 | Shimizu et al. | |
| 2007/0013709 A1* | 1/2007 | Charles | G06T 19/00 345/581 |
| 2011/0043525 A1 | 2/2011 | Uchikura et al. | |
| 2013/0249906 A1* | 9/2013 | Gunderson | G06T 15/20 345/420 |
| 2016/0048293 A1* | 2/2016 | Chen | G06F 3/04815 715/851 |
| 2016/0125654 A1 | 5/2016 | Shikoda et al. | |
| 2016/0275209 A1* | 9/2016 | Kelly | G06T 19/00 |

FOREIGN PATENT DOCUMENTS

| | | |
|---|---|---|
| JP | 2008-1588575 A | 7/2008 |
| JP | 2011-43934 A | 3/2011 |
| JP | 2013-200818 A | 10/2013 |
| JP | 2014-215769 A | 11/2014 |
| JP | 2014215769 A * | 11/2014 |
| JP | 2016-62403 A | 4/2016 |
| KR | 10-2002-0068304 | 6/2002 |
| KR | 10-2015-0139610 | 12/2015 |

OTHER PUBLICATIONS

Roberto Raffaeli et al., "Automation of drafting execution by schemes definitions and feature recognition", *Computer-Aided Design and Applications*, vol. 13, No. 4, Jan. 4, 2016, pp. 459-470 (XP055672517, DOI: 10. 1080/16864360.2015.1131538, sections 3 & 4; figures 5,7,8,12).

Extended European Search Report dated Mar. 11, 2020 for the corresponding European Patent Application No. 17839146.2.

* cited by examiner

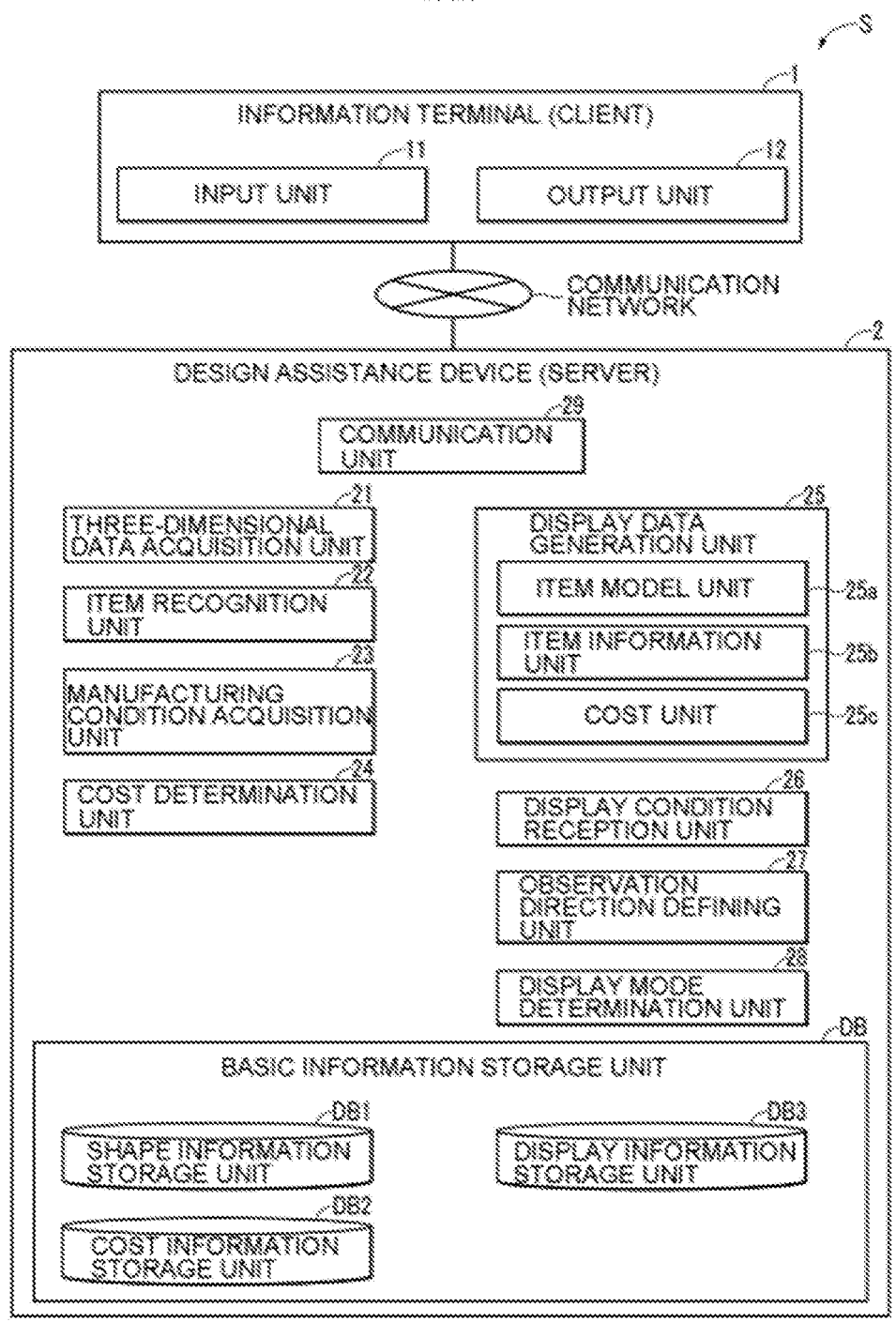

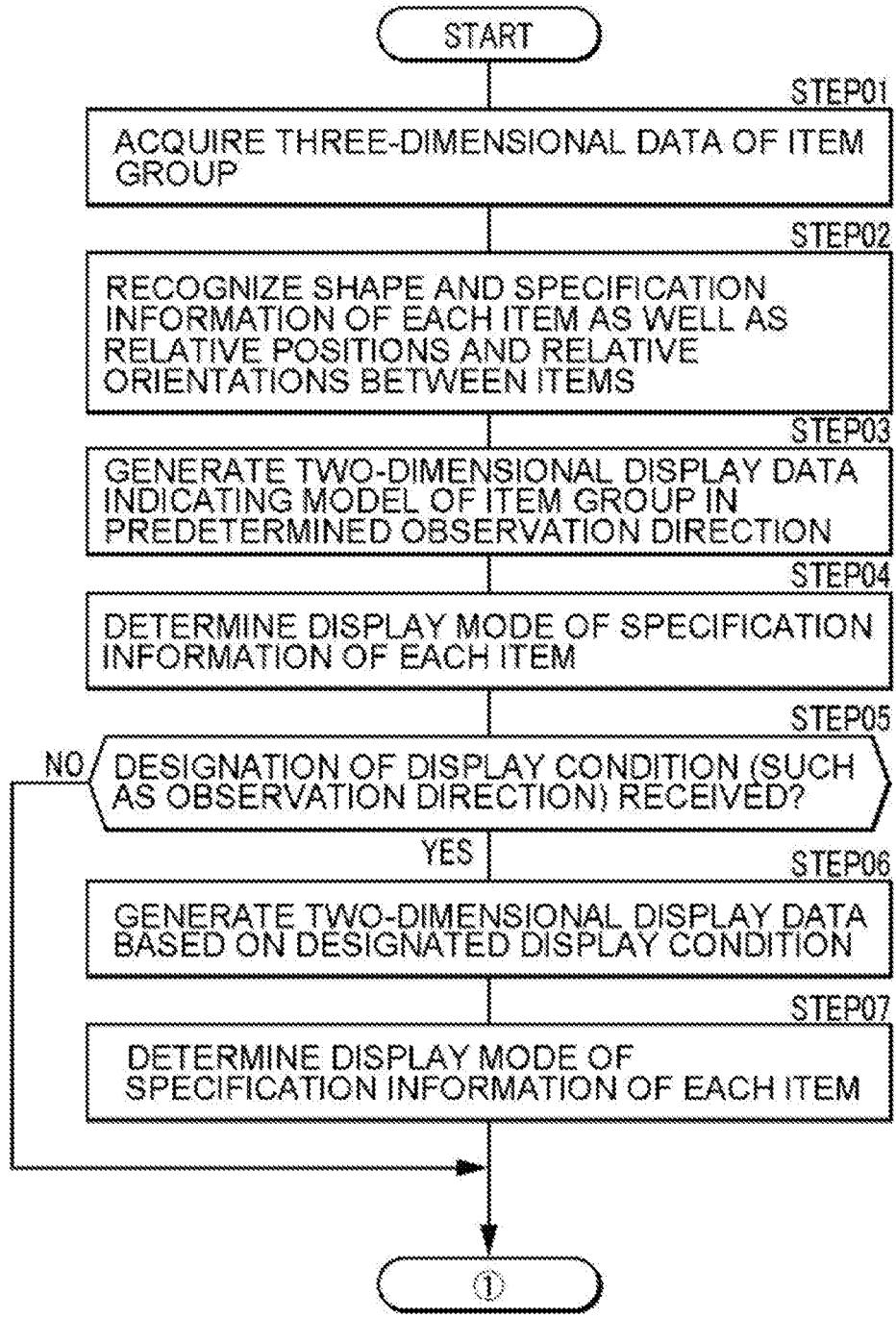

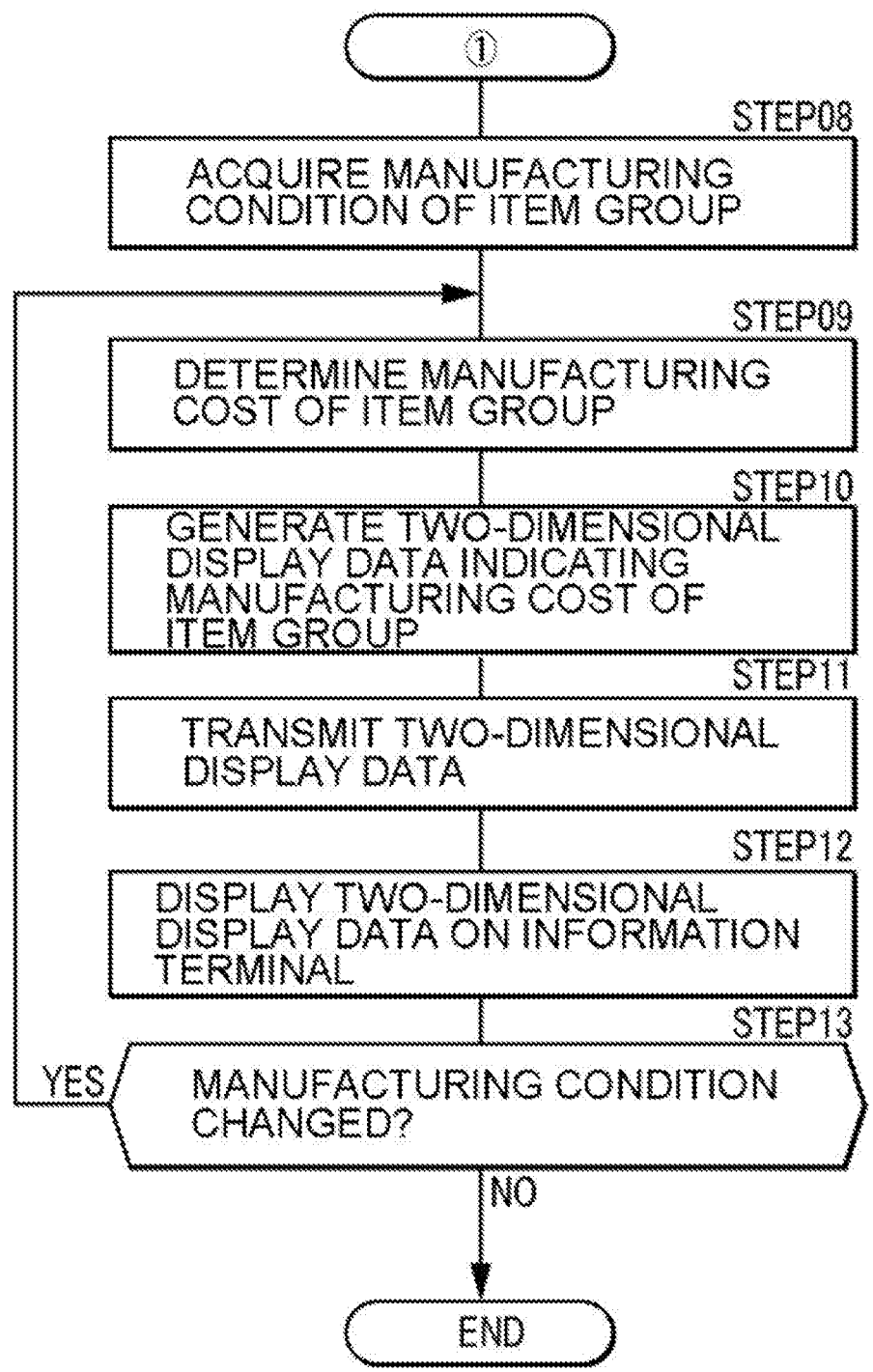

FIG.3

PROJECT LIST | ORDER HISTORY

12a1 — DROP 3D CAD FILE HERE.

12a2 — PROJECT 1: EJECTOR PIN SET A

12a3 — PROJECT 2: EJECTOR PIN SET B

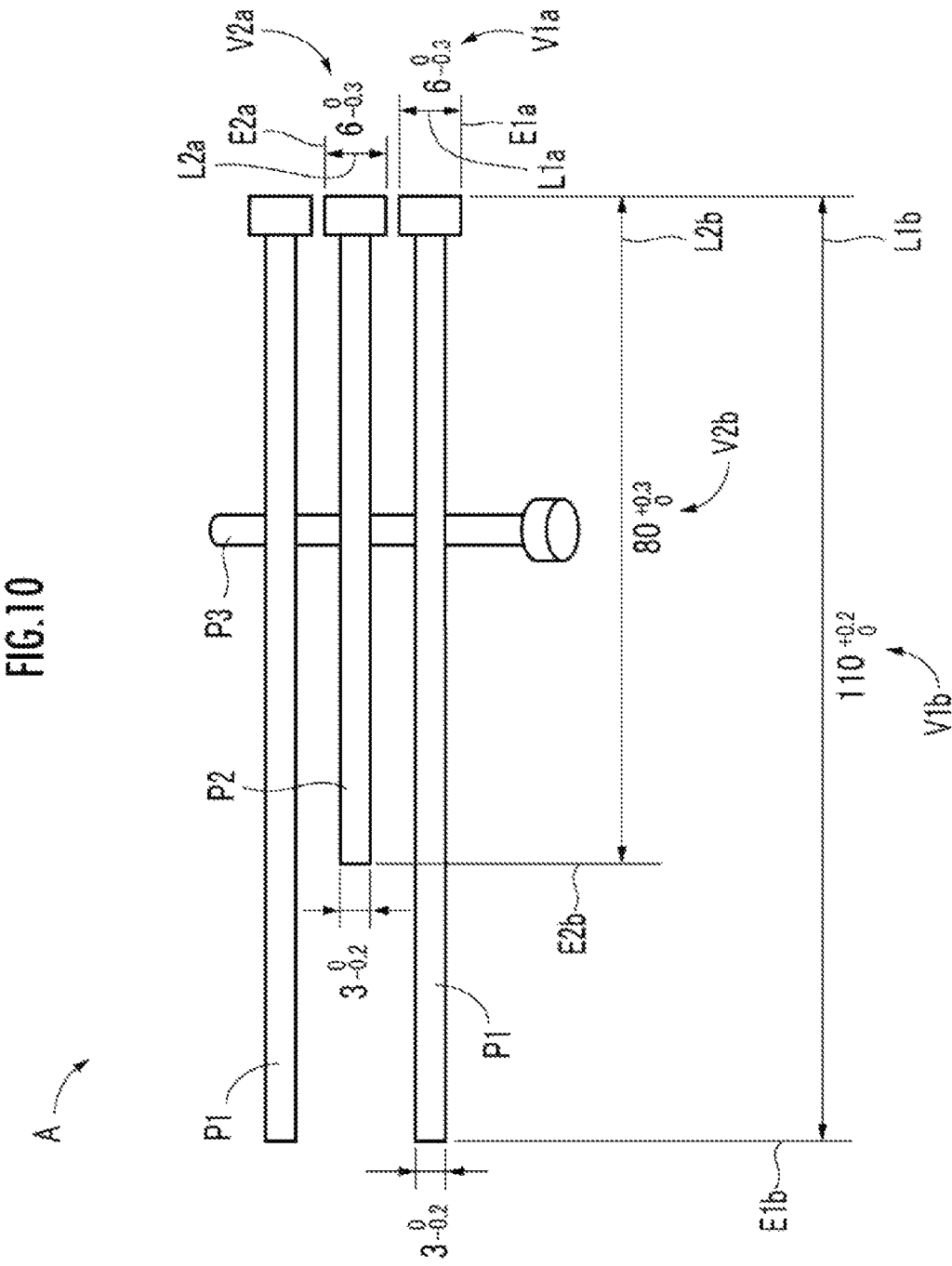

ASSISTANCE DEVICE, DESIGN ASSISTANCE SYSTEM, SERVER, AND DESIGN ASSISTANCE METHOD

CROSS-REFERENCE TO RELATED PATENT APPLICATIONS

This application is a U.S. National Phase application under 35 U.S.C. § 371 of International Patent Application No. PCT/JP2017/025711, filed Jul. 14, 2017, and claims the benefit of Japanese Patent Application No. 2016-157027, filed on Aug. 9, 2016, all of which are incorporated herein by reference in their entirety. The International Application was published in Japanese on Feb. 15, 2018 as International Publication No. WO/2018/030073 under PCT Article 21(2).

FIELD OF THE INVENTION

The present invention relates to a design assistance device, a design assistance system, a server, and a design assistance method for performing design assistance in designing an item group including a plurality of items.

BACKGROUND OF THE INVENTION

Conventionally, construction or display software, such as CAD (Computer-Aided Design) software, is known as a design assistance tool for designing (examining the shape, dimension, placement, and the like) machinery or the like (hereinafter, also referred to as "item group") including a plurality of parts, such as sheet metal parts, machining parts, press parts, and injection molding parts (hereinafter, also collectively referred to as "items") (for example, see Japanese Unexamined Publication No. 2002-324086).

Another example of a known design assistance tool includes a system that displays an item group and estimates the manufacturing cost (price or delivery date) of the item group based on input drawing data (for example, CAD data) (for example, see Japanese Unexamined Publication No. 2013-200818).

Technical Problems

To provide beneficial design assistance information to a user, it is preferable that the design assistance tool clearly indicate, to the user, the shape and the like of the item group being designed. In addition, it is also preferable that not only the shape of the item group, but also each item included in the item group and specification information (for example, dimension display) of the item be clearly indicated to the user.

The present invention has been made in view of the above, and an object of the present invention is to provide a design assistance device, a design assistance system, a server, and a design assistance method that can display shapes and specification information of a plurality of items included in an item group so that a user can easily view the items, thereby indicating beneficial design assistance information to the user.

SUMMARY OF THE INVENTION

Solution to Problems

To attain the object, the present invention provides a design assistance device comprising: a three-dimensional data acquisition unit acquiring three-dimensional data of an item group including a plurality of items; a display data generation unit generating two-dimensional display data including two-dimensional display representing an appearance of the item group and specification information of at least one of the plurality of items in one observation direction in the three-dimensional data; and a display mode determination unit determining a display mode of the specification information of each of the plurality of items in the two-dimensional display based on a shape of each of the plurality of items as well as relative positions and relative orientations between the plurality of items as viewed in the one observation direction.

In the design assistance device of the present invention, the display data generation unit generates the two-dimensional display data based on the input three-dimensional data, and the display mode determination unit determines the display mode of the specification information of each item. Here, the display mode determination unit refers to the shape of each of the plurality of items as well as the relative positions and the relative orientations between the plurality of items to determine the display mode. This prevents the item or the specification information regarding the item from obstructing the display of another item. Therefore, the clarity of the specification information of each item is improved. As a result, the shapes and the specification information of the plurality of items included in the item group can be displayed so that the user can easily view the items, and beneficial design assistance information can be indicated to the user.

Preferably, the design assistance device of the present invention further includes a display condition reception unit receiving designation of another observation direction different from the one observation direction of the item group, in which the display data generation unit generates two-dimensional display data including two-dimensional display representing an appearance of the item group and specification information of the at least one item in the other observation direction received by the display condition reception unit, and the display mode determination unit determines a display mode of the specification information of each of the plurality of items in the two-dimensional display based on a shape of each of the plurality of items as well as relative positions and relative orientations between the plurality of items as viewed in the other observation direction.

According to the configuration, when the user designates an arbitrary observation direction, the two-dimensional display data is generated, and the display mode of the two-dimensional display data is determined based on the observation direction. As a result, clear specification information can be displayed in the observation direction desired by the user.

Preferably, in the design assistance device of the present invention, the display mode determination unit determines a display position of the specification information of each of the plurality of items in the two-dimensional display so that a display position of the specification information of one of the plurality of items is separated by equal to or more than a predetermined interval from a display position of the specification information of another item.

The display position of the specification information of each item is determined so that the display position is separated by equal to or more than the predetermined interval, and therefore, the display of the specification information of each item can be clearly distinguished.

Preferably, in the design assistance device of the present invention, the specification information is a dimension of each of the plurality of items, and the display mode determination unit determines a position of a dimension line of each of the plurality of items to determine a display position of the dimension of each of the plurality of items in the two-dimensional display.

The dimension display in the specification information of the item is clearly displayed, and the display mode of the dimension display is set by adjusting the position of the dimension line. This clarifies the dimension display of each item that is an important parameter in designing.

Preferably, in the design assistance device of the present invention, the display mode determination unit determines to exclude the display of the specification information of at least one of the plurality of items in the two-dimensional display.

For example, the specification display of an unimportant item or an item with a large overlap section can be deleted (excluded) to improve the clarity of the display of a predetermined parameter (for example, important parameter such as dimension).

Preferably, the design assistance device of the present invention further includes, a manufacturing condition acquisition unit acquiring a manufacturing condition that can be selected in manufacturing each of the plurality of items; and a cost determination unit determining a manufacturing cost of the item group corresponding to the manufacturing condition acquired by the manufacturing condition acquisition unit.

By providing the design assistance device with the cost determination function, the design assistance device can also function as an automatic estimation device that clearly displays the items to the user and that allows the user to recognize the manufacturing cost.

Preferably, the design assistance device of the present invention further includes, a communication unit transmitting the two-dimensional display data to outside.

By providing the design assistance device with the communication unit, the design assistance information can be provided to various external devices.

To attain the object, the present invention provides a design assistance system including: the design assistance device; and an information terminal including an input unit inputting the three-dimensional data and an output unit displaying the two-dimensional display data.

To attain the object, the present invention provides a server including: a three-dimensional data acquisition unit acquiring three-dimensional data of an item group including a plurality of items through an information terminal; a display data generation unit generating two-dimensional display data including two-dimensional display representing an appearance of the item group and specification information of at least one of the plurality of items in one observation direction in the three-dimensional data; a display mode determination unit determining a display mode of the specification information of each of the plurality of items in the two-dimensional display based on a shape of each of the plurality of items as well as relative positions and relative orientations between the plurality of items as viewed in the one observation direction; and a communication unit transmitting the two-dimensional display data to the information terminal.

To attain the object, the present invention provides a design assistance method including: a step of acquiring three-dimensional data of an item group including a plurality of items; a step of generating two-dimensional display data including two-dimensional display representing an appearance of the item group and specification information of at least one of the plurality of items in one observation direction in the three-dimensional data; and a step of determining a display mode of the specification information of each of the plurality of items in the two-dimensional display based on a shape of each of the plurality of items as well as relative positions and relative orientations between the plurality of items as viewed in the one observation direction.

BRIEF DESCRIPTION OF THE DRAWINGS

FIG. 1 is a block diagram showing a configuration of a design assistance system according to an embodiment of the present invention.

FIG. 2A is a flow chart showing a processing flow of a server in the design assistance system according to the embodiment of the present invention.

FIG. 2B is a flow chart showing the processing flow of the server in the design assistance system according to the embodiment of the present invention.

FIG. 3 is a diagram showing an example of an image displayed on an information terminal of the design assistance system according to the embodiment of the present invention.

FIG. 4 is a diagram showing an example of an image displayed on the information terminal of the design assistance system according to the embodiment of the present invention.

FIG. 6 is a diagram showing an example of an image displayed on the information terminal of the design assistance system according to the embodiment of the present invention.

FIG. 8 is a diagram showing an example of an image displayed on the information terminal of the design assistance system according to the embodiment of the present invention.

FIG. 9 is a diagram showing an example of an image displayed on the information terminal of the design assistance system according to the embodiment of the present invention.

FIG. 10 is an enlarged view of a model display section of FIG. 9.

DETAILED DESCRIPTION OF THE INVENTION

Figure 5:
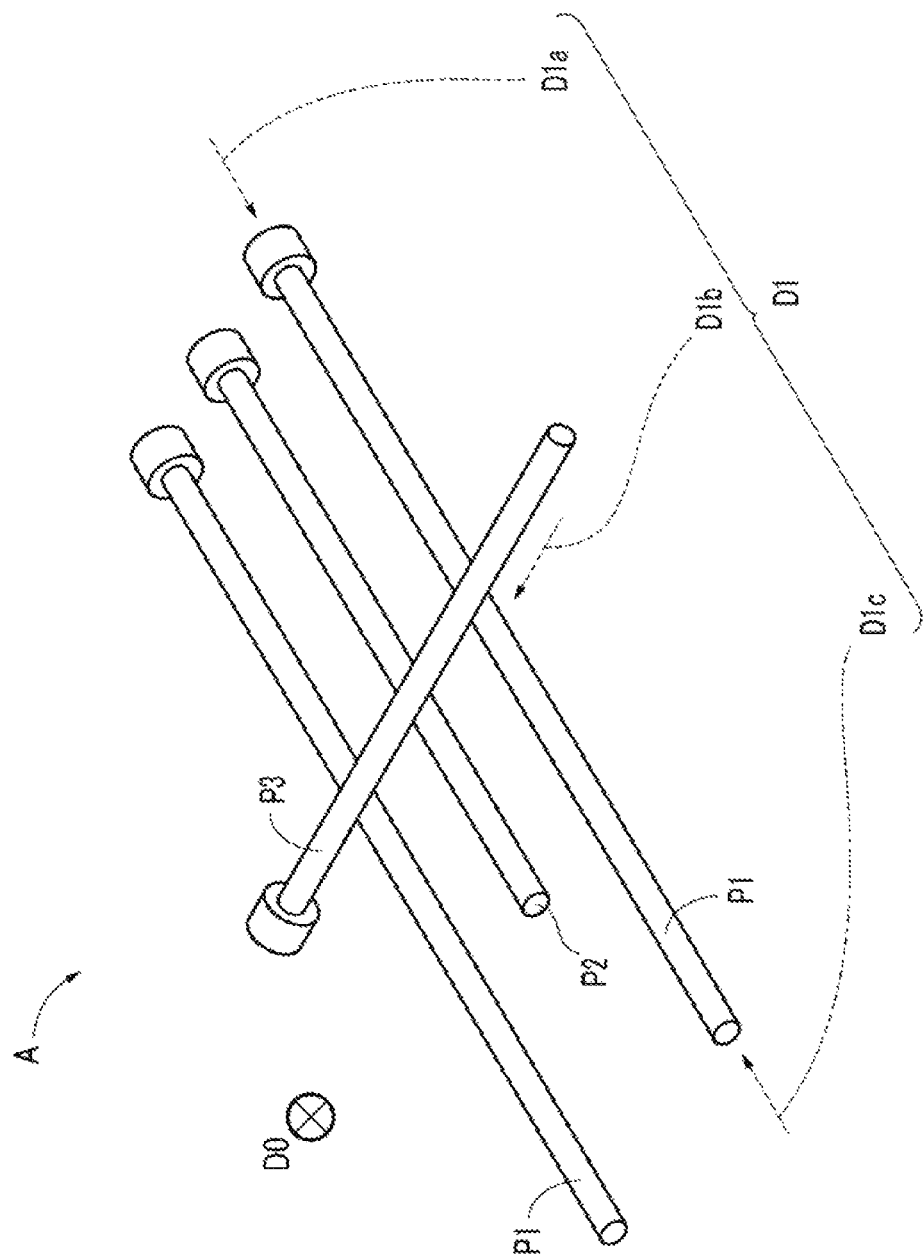
FIG. 5 is a diagram schematically showing individual observation directions defined by an observation direction defining unit of the server in the design assistance system according to the embodiment of the present invention.

Hereinafter, an embodiment of the present invention will be described with reference to the drawings. First, a configuration of a design assistance system S of the present embodiment will be described with reference to FIG. 1.

As shown in FIG. 1, the design assistance system S includes an information terminal 1 operated by a user and a design assistance device 2 connected to the information terminal 1 through a communication network such as the Internet. The design assistance system S assists the design of machinery or the like (hereinafter, referred to as "item group") including a plurality of parts, such as sheet metal parts, machining parts, press parts, and injection molding parts (hereinafter, collectively referred to as "items").

In a case described below, the design assistance system S (information terminal 1 and design assistance device 2) functions as a system for executing a design assistance method of the present invention. However, the design assistance method of the present invention can also be applied to systems other than the system including the information terminal 1 and the design assistance device 2. For example, the design assistance method of the present invention may be applied to a single information terminal including an input unit 11 and an output unit 12 of the information terminal 1 as well as each processing unit and a storage unit of the design assistance device 2.

In addition, the design assistance system S in the present embodiment constructs a client server system including the information terminal 1 as a client and the design assistance device 2 as a server. In other words, various types of information processing are executed in the design assistance device 2 according to operation of the information terminal 1 by the user, and results of the processing are provided to the user through the information terminal 1.

In the present embodiment, the information terminal 1 transmits information of the item group (for example, data of drawings or information regarding specifications of each item) as a target of the design assistance to the design assistance device 2 according to operation of the user. The design assistance device 2 generates display data indicating a model of the item group, detailed information of each item, and the manufacturing cost of the item group based on the information of the item group received from the information terminal 1 and transmits the display data to the information terminal 1. The display data generated by the design assistance device 2 is displayed on the information terminal 1.

The information terminal 1 includes the input unit 11 (input interface) including an input device, such as a keyboard, a mouse, and a touch panel, and the output unit 12 (output interface) including an output device, such as a liquid crystal display and a speaker. The information input by the user to the information terminal 1 through the input unit 11 is transmitted to the design assistance device 2. The display data generated in the information processing executed by the design assistance device 2 is transmitted (returned) to the information terminal 1, displayed on the output unit 12, and presented to the user.

Note that the information terminal 1 may include a user interface, such as a touch-panel display, in which the input unit 11 and the output unit 12 are integrated. Therefore, the input unit 11 and the output unit 12 may be separately provided or may be provided as an integrated input-output interface.

In the present embodiment, the design assistance device 2 is an electronic unit including a CPU, a memory, and the like. The design assistance device 2 includes a three-dimensional data acquisition unit 21, an item recognition unit 22, a manufacturing condition acquisition unit 23, a cost determination unit 24, a display data generation unit 25, a display condition reception unit 26, an observation direction defining unit 27, a display mode determination unit 28, and a communication unit 29. In the present embodiment, the design assistance device 2 further includes a basic information storage unit DB storing basic information for the design assistance device 2 to assist the design.

The three-dimensional data acquisition unit 21 acquires three-dimensional data of an item group including a plurality of items through the information terminal 1. The three-dimensional data acquired by the three-dimensional data acquisition unit 21 includes, for example, data defining space occupancy modes, shapes, and the like of the items in a virtual three-dimensional space. The three-dimensional data is, for example, 3D-CAD data.

In the present embodiment, the design assistance device 2 has a function of assisting the design based on the acquired three-dimensional data. In the present embodiment, the three-dimensional data input to the input unit 11 of the information terminal 1 by the user and transmitted from the information terminal 1 is received by the communication unit 29 of the design assistance device 2 and supplied to the three-dimensional data acquisition unit 21.

The item recognition unit 22 analyzes the three-dimensional data acquired by the three-dimensional data acquisition unit 21 to individually recognize the items included in the item group. In the present embodiment, the item recognition unit 22 recognizes the shape and the specification information of each of the plurality of items included in the item group as well as the relative positions and the relative orientations between the items from the three-dimensional data.

Note that the specification information of the item here is, for example, information indicating detailed specifications of the item, such as information indicating the dimension of each item, the dimensional tolerance that is an allowable error of the dimension, and information indicating the surface roughness.

In the present embodiment, the basic information storage unit DB of the design assistance device 2 includes a shape information storage unit DB1 storing information regarding the shapes, partial shapes, types, and the like of various basic items. The information stored in the shape information storage unit DB1 is basic information for the item recognition unit 22 to recognize the items. The item recognition unit 22 uses the basic information in the shape information storage unit DB1 to recognize the items by breaking down the item group from the input three-dimensional data into the items.

The manufacturing condition acquisition unit 23 acquires manufacturing conditions that can be selected in manufacturing each item recognized by the item recognition unit 22 based on the shape and the specification information of the item. The cost determination unit 24 determines the manufacturing cost (manufacturing expenses and manufacturing period) of each item based on the manufacturing conditions of each item acquired by the manufacturing condition acquisition unit 23 and determines the manufacturing cost of the item group.

In the present embodiment, the basic information storage unit DB of the design assistance device 2 includes a cost information storage unit DB2 storing information regarding manufacturing processes corresponding to the shapes and the specification information of the items as well as the period and the expenses of each process. The information stored in the cost information storage unit DB2 is basic information for processes executed by the manufacturing condition acquisition unit 23 and the cost determination unit 24. The manufacturing condition acquisition unit 23 selectively acquires the manufacturing conditions of each item based on the information in the cost information storage unit DB2 and designation of the user through the information terminal 1. In addition, the cost determination unit 24 determines the manufacturing cost corresponding to the manufacturing conditions acquired by the manufacturing condition acquisition unit 23 based on the information in the cost information storage unit DB2.

In the present embodiment, the display data generation unit 25 generates two-dimensional display data (hereinafter, also simply referred to as "display data") indicating information of the item group representing the appearance or the like of the item group in a predetermined observation direction (also referred to as projection direction or optic axis direction) and information of the manufacturing cost of the item group determined by the cost determination unit 24. The display data generated by the display data generation unit 25 includes two-dimensional display representing the appearance of the item group in the one observation direction and the specification information of at least one of the items.

In the present embodiment, the display data generation unit 25 includes an item model unit 25a that generates display data representing a model of the item group in the predetermined observation direction. The display data generation unit 25 further includes an item information unit 25b that generates display data for displaying the information of the item group and each item using letters, numbers, symbols, and the like and includes a cost unit 25c that generates display data for displaying the manufacturing cost of the item group.

In the present embodiment, the basic information storage unit DB of the design assistance device 2 includes a display information storage unit DB3 storing information regarding the format for the display data, such as a frame, a layout, and a font. The information stored in the display information storage unit DB3 is basic information for the display data generation unit 25 to generate the display data. The display data generation unit 25 performs a generation action of the display data based on the information in the display information storage unit DB3.

The display condition reception unit 26 receives display conditions for the display data generation unit 25 to generate the display data. The display condition reception unit 26 receives, for example, designation of the display conditions from the user through the communication unit 29 based on operation of the information terminal 1.

For example, the display condition reception unit 26 receives designation of a specific item (selection designation) and designation of a specific observation direction of the item group and supplies the designation to the display data generation unit 25. For example, when the display condition reception unit 26 receives the designation of the observation direction of the item group, the item model unit 25a of the display data generation unit 25 generates display data including two-dimensional display representing the appearances, the specification information, and the relative positions of the items in the designated observation direction.

Based on the shape of each of the plurality of items and the relative positions between the items recognized by the item recognition unit 22, the observation direction defining unit 27 defines one of one or a plurality of individual observation directions that are specific observation directions regarding the plurality of items and an entire observation direction that is a specific observation direction regarding the item group. Specifically, based on the acquired three-dimensional data, the observation direction defining unit 27 in the present embodiment defines the observation direction of the entire item group as the entire observation direction and defines at least one observation direction of each item as the individual observation direction.

The entire observation direction or the individual observation direction defined by the observation direction defining unit 27 is supplied to the display data generation unit 25. That is, the display data generation unit 25 generates display data including two-dimensional display representing the appearance of the item group and the specification information of each item in the entire observation direction or the individual observation direction defined by the observation direction defining unit 27.

The display mode determination unit 28 determines a display mode of the specification information of each item based on the shape of each item and the relative positions between the items of the case in which the display data generated by the display data generation unit 25 is displayed. That is, the display mode generation unit 28 determines the display mode of the specification information of each item in the two-dimensional display of the item group based on the appearance of each item as well as the relative positions and the relative orientations between the items in the one observation direction.

In the present embodiment, the display mode determination unit 28 determines the display position or the display orientation of the specification information of each item at the time of the two-dimensional display of the two-dimensional data generated by the display data generation unit 25.

Specifically, the item model unit 25a of the display data generation unit 25 generates display data including two-dimensional display representing the item group (appearances, specification information, relative positions, and relative orientations of items) in the observation direction defined by the observation direction defining unit 27 or in the observation direction designated by the user and received by the display condition reception unit 26.

In the present embodiment, the display data generated by the display data generation unit 25 is supplied to the display mode determination unit 28. The display mode determination unit 28 determines the display state of the specification information in the two-dimensional display of the display data to, for example, move the display position or change the display orientation. In the present embodiment, the display data including the display mode of the specification information determined by the display mode determination unit 28 is transmitted to the information terminal 1 through the communication unit 29 and output to (displayed by) the output unit 12 of the information terminal 1.

Note that for each piece of specification information, the display mode determination unit 28 determines various modes for displaying the specification information, such as display size, display color, and font, in addition to the display position and the display orientation (direction, angle of the direction, and the like) of the specification information. In the present embodiment, the information regarding the display size, the display color, the font, and the like is stored in the display information storage unit DB3, and the display mode determination unit 28 reads the information in the display information storage unit DB3 to determine (select) the display size and the like of each piece of specification information.

In addition, the display mode determination unit 28 in the present embodiment determines to exclude the specification information of at least one item at the generation or after the generation of the display data by the display data generation unit 25 (that is, before the display on the information terminal 1) or after the transmission of the display data to the information terminal 1 (that is, during the display on the information terminal 1). That is, the display mode determination unit 28 in the present embodiment selects (determines) not to display at least one piece of specification information of at least one item in the two-dimensional display of the display data.

Note that in the present embodiment, the display data generation unit 25 may generate display data for initial screen output to the output unit 12 of the information terminal 1 to start the design assistance and may generate display data for screen for guiding the input operation of the three-dimensional data.

The display data generation unit 25 may also generate display data for screen for saving the data being designed in the information terminal 1 or may generate display data for screen for pausing or ending the design assistance. For a user with a history of design assisted by the design assistance device 2, the display data generation unit 25 may also generate display data for displaying a screen for selecting data of the design assisted in the past, in addition to the acquisition (new acquisition) of the three-dimensional data.

In this way, when, for example, the display data generation unit 25 generates display data for which the three-dimensional data does not have to be acquired, the display data generated by the display data generation unit 25 may be transmitted to the information terminal 1 without being supplied to the display mode determination unit 28. In other words, the communication unit 29 transmits the display data generated by the display data generation unit 25 or the display data of the mode determined by the display mode determination unit 28 to the information terminal 1.

Figure 3:
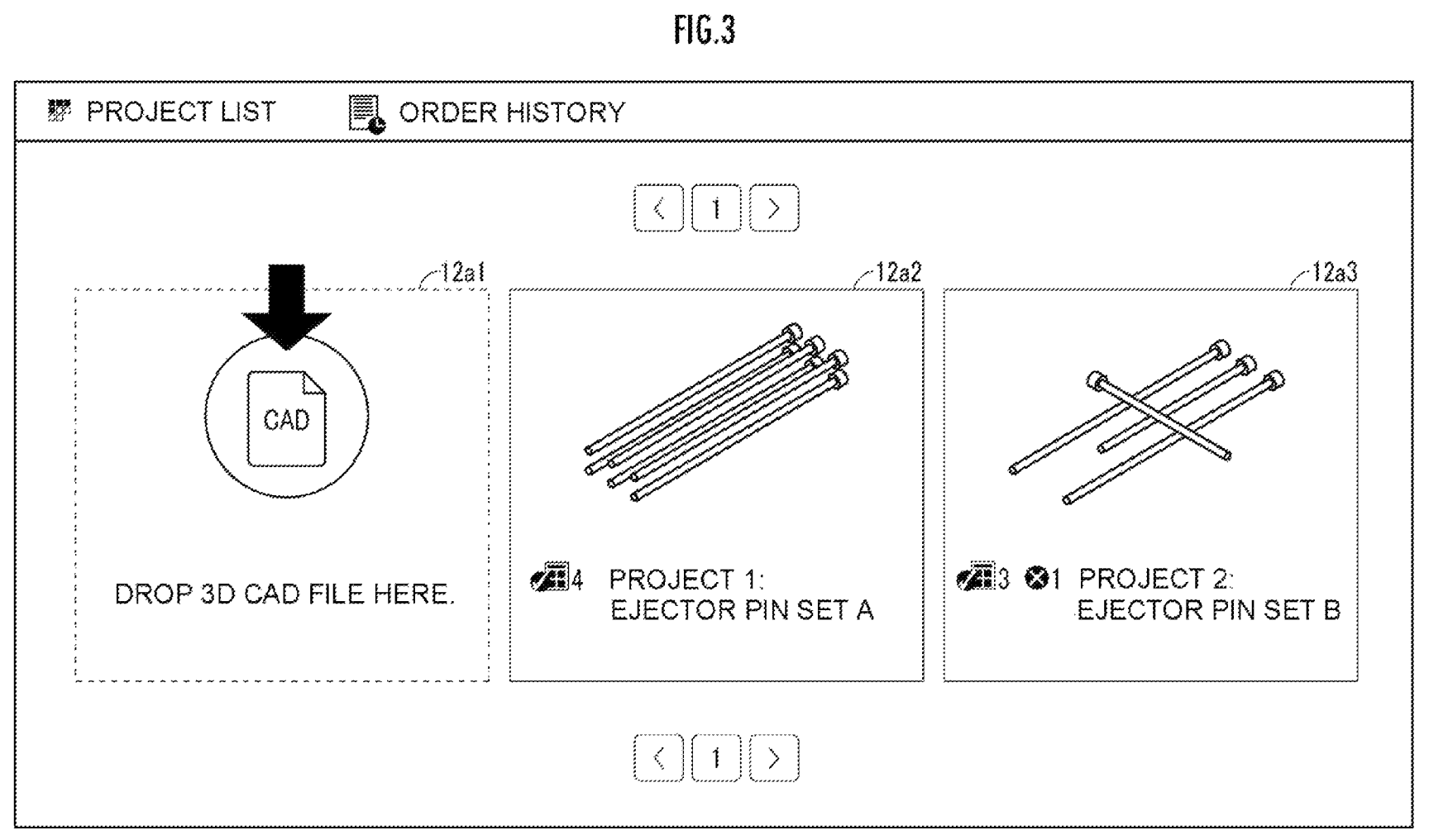
Figure 4:
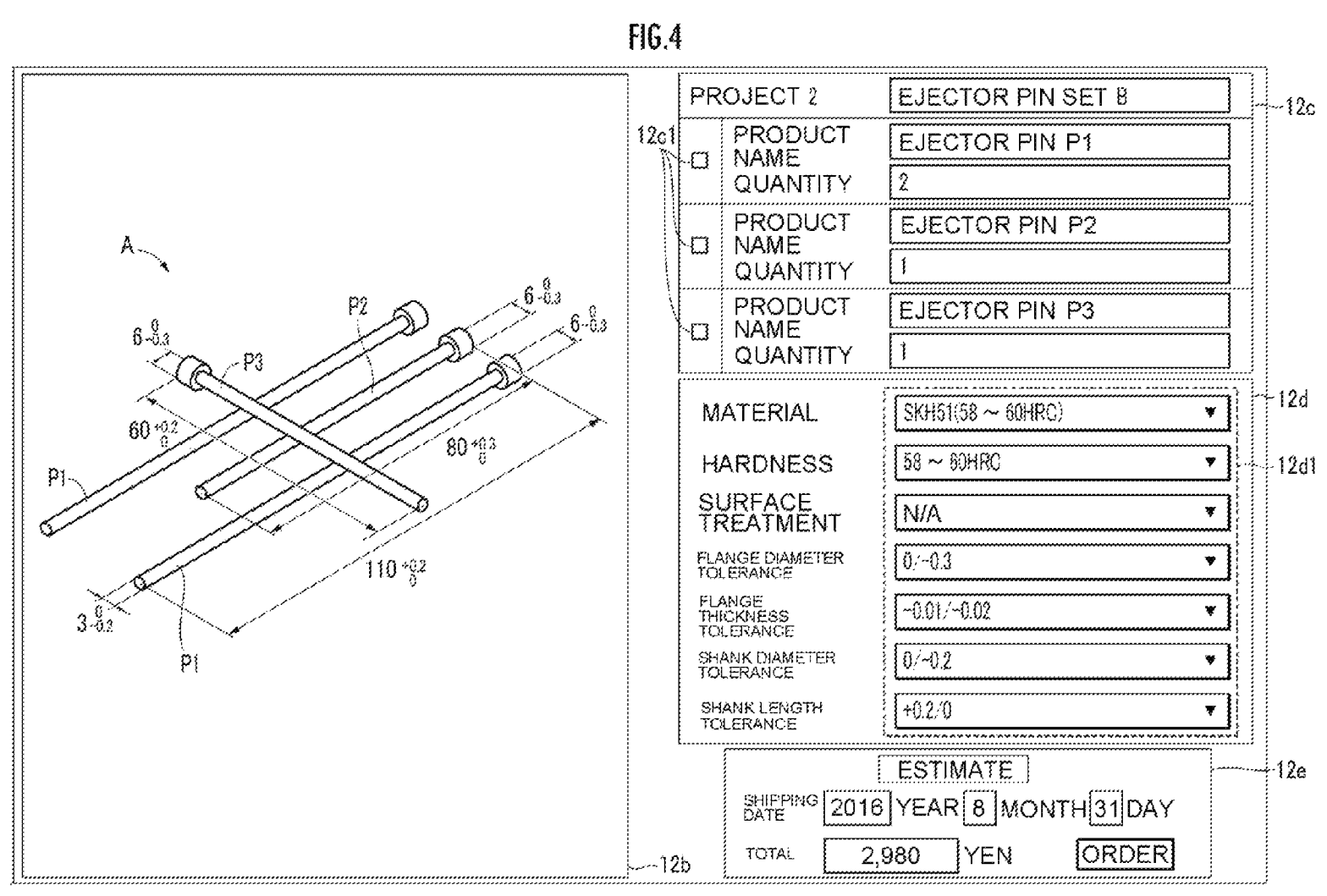

Next, detailed actions of the processing units of the design assistance device 2 and the order of actions will be described with reference to FIGS. 2A, 2B, and 3 to 10. First, FIGS. 2A and 2B are flow charts showing a flow of a design assistance action of the design assistance device 2. The design assistance device 2 starts the design assistance action when the information terminal 1 accesses the design assistance device 2 to upload or select the three-dimensional data to be assisted.

First, the three-dimensional data acquisition unit 21 acquires three-dimensional data, such as CAD data, of the item group from the information terminal 1 (FIG. 2A/STEP01). For example, the three-dimensional data transmitted from the information terminal 1 is received by the communication unit 29 of the design assistance device 2 through a network line and supplied to the three-dimensional data acquisition unit 21.

Specifically, once the display data generation unit 25 detects the access from the information terminal 1, the display data generation unit 25 generates display data that configures the input unit (input interface) 11 of the information terminal 1 for acquiring (or selecting) the screen for starting the design assistance and the three-dimensional data to be assisted. The display data generation unit 25 transmits the generated display data to the information terminal 1 through the communication unit 29. The user operates the information terminal 1 based on the operation guide information output to the output unit 12 of the information terminal 1 and uploads the three-dimensional data. In this way, the three-dimensional data acquisition unit 21 acquires the three-dimensional data.

FIG. 3 is a diagram showing a display example in the information terminal 1 displaying the display data for guiding acquisition or selection of the three-dimensional data generated by the display data generation unit 25 in STEP01 of FIG. 2A.

As shown in FIG. 3, the display data generation unit 25 generates display data for guiding the input operation including three-dimensional data reception display sections 12a1 to 12a3. In the present embodiment, the three-dimensional data reception display section 12a1 is a reception display section for newly uploading the three-dimensional data. The three-dimensional data reception display sections 12a2 and 12a3 are reception display sections for selecting an item group assisted in the past by the design assistance device 2.

The user newly uploads the three-dimensional data or selects already uploaded three-dimensional data according to the displayed input guide screen. The uploaded or selected three-dimensional data is acquired by the three-dimensional data acquisition unit 21.

Note that the display data generation unit 25 does not have to generate the display data for the design assistance start screen or for the data acquisition screen. For example, image data for guiding the operation may be stored in advance in the information terminal 1 when an application for cooperating with the design assistance device 2 is installed in the information terminal 1. In this case, the information terminal 1 may upload or select the three-dimensional data according to the guide of the application.

Next, with reference to FIG. 2A, the item recognition unit 22 performs a recognition (analysis) action of each of the plurality of items included in the item group (FIG. 2A/STEP02). Specifically, the item recognition unit 22 compares and collates the shape data included in the acquired three-dimensional data and the shape information stored in the shape information storage unit DB1 to recognize the shape (hereinafter, also referred to as "solid") of each item. Here, the item recognition unit 22 recognizes the shape and the specification information of each of the plurality of items as well as the relative positions and the relative orientations between the items.

Subsequently, the display data generation unit 25 generates display data including two-dimensional display of a model of the item group (FIG. 2A/STEP03). Specifically, the item model unit 25a of the display data generation unit 25 creates a 3D model of the item group. The item model unit 25a also generates display data indicating a 2D model of the item group (that is, the shape and the specification information of each item as well as the relative positions and the relative orientations between the items) as viewed in the predetermined observation direction (for example, initial entire observation direction).

In the present embodiment, the model of the item group generated by the item model unit 25a of the display data generation unit 25 defines, on a virtual space, three-dimensional coordinate axes for modeling the item group and each item in creating the 3D model. The item model unit 25a then plots coordinate values read from the three-dimensional data on the virtual space to create a 3D model indicating the shapes and the placement relationship of the item group and the items on the virtual space.

Next, the item model unit 25a rotates the created 3D model and projects the item group and each item corresponding to, for example, the initial observation direction. The item model unit 25a then generates two-dimensional image (display image) data indicating the item group projected in the initial observation direction (from the observation point). This is the display data indicating the 2D model of the item group.

Next, the display mode determination unit 28 determines the display mode of the specification information of each item based on the shape of each item as well as the relative positions and the relative orientations between the items in the predetermined observation direction (FIG. 2A/STEP04). Note that here, the initial observation direction of the item group in displaying the display data can be, for example, the entire observation direction defined by the observation direction defining unit 27.

Next, whether a display condition in generating the display data is designated is determined (FIG. 2A/STEP05). In the present embodiment, the display condition reception unit 26 of the design assistance device 2 receives designation of the display condition from the user. When the display condition reception unit 26 receives the designation of the display condition, the display data generation unit 25 determines that the display condition is designated.

The display data generation unit 25 generates two-dimensional data based on the designated display condition when the display condition is designated (FIG. 2A/STEP06). For example, when the display condition reception unit 26 receives designation of the observation direction of the item group, the display condition reception unit 26 supplies information indicating the designated observation direction to the display data generation unit 25. The item model unit 25a of the display data generation unit 25 generates display data including two-dimensional display representing the appearance of the item group and the specification information of each item in the designated observation direction.

In addition, when, for example, the display condition reception unit 26 receives designation of a specific item, the display data generation unit 25 generates display data in a mode (for example, observation direction, display position of specification information, and the like) suitable for displaying the designated item.

Specifically, when a specific item is designated, the observation direction defining unit 27 supplies the observation direction, that is, the individual observation direction, for preferentially displaying the specific item to the display data generation unit 25. The display data generation unit 25 generates display data indicating the shape (appearance) and the specification information of each item as well as the relative positions between the items when the item group is viewed in the individual observation direction.

Here, the item model unit 25a rotates the 3D model by rotating, on the virtual space, the three-dimensional coordinate axes of the 3D model defined just after the three-dimensional data is read. The item model unit 25a then sets the positions and the scales of the three-dimensional coordinate axes according to the observation direction for observing the item group based on the received (designated) display condition. In this way, the display data based on the designated display condition is generated.

Subsequently, the display mode determination unit 28 determines the display mode of the specification information of each item in the two-dimensional data generated by the display data generation unit 25 based on the designated condition (FIG. 2A/STEP07). That is, the display mode determination unit 28 in the present embodiment determines (redetermines) the display (for example, dimension display) of the specification information in the display data when the display condition of the model of the item group is acquired or changed.

For example, when the designated display condition is different from the initial display condition, the display mode determination unit 28 determines to move the display position of the specification information of each item, change the display orientation, or exclude the display based on the designated display condition.

Here, when the display data is regenerated based on the designated condition, the display orientation of the displayed specification information (dimension value or symbol) as viewed in the initial observation direction is rotated (tilted), and the display of the specification information may become unclear. The display mode determination unit 28 can change the display orientation of the specification information when the display orientation of the specification information is tilted by equal to or more than a predetermined amount according to the change in the observation direction. For example, when the display orientation of the specification information is tilted by equal to or more than a predetermined angle, the display mode determination unit 28 can determine to change (rotate) the display orientation of the specification information so that the display orientation is perpendicular to the observation direction based on the designated condition.

Note that when it is determined that the display condition is not acquired in STEP05, the item model unit 25a of the display data generation unit 25 may not generate the display data for displaying the model, and the display mode determination unit 28 may not determine the display mode.

Next, with reference to FIG. 2B, the manufacturing condition acquisition unit 23 acquires manufacturing conditions of the item group (FIG. 2B/STEP08). Specifically, the manufacturing condition acquisition unit 23 acquires manufacturing conditions that can be selected in manufacturing the items based on, for example, the information in the cost information storage unit DB2 of the basic information storage unit DB and based on the designation from the user. For example, the manufacturing condition acquisition unit 23 acquires manufacturing conditions necessary for manufacturing the items (such as material, hardness, and surface treatment), the manufacturing process of the items, the manufacturing time, and the like. Note that the manufacturing condition acquisition unit 23 may ask the user to select the acquired manufacturing conditions.

Subsequently, the cost determination unit 24 determines the manufacturing cost (for example, price or delivery date) of the item group corresponding to the acquired (selected) manufacturing conditions (FIG. 2B/STEP09). Specifically, the cost determination unit 24 determines the manufacturing cost of each item that corresponds to the acquired or selected manufacturing conditions and that varies according to the manufacturing conditions. The cost determination unit 24 determines the manufacturing cost of each item to determine the manufacturing cost of the entire item group.

Next, the display data generation unit 25 generates display data including two-dimensional display of the manufacturing cost of the item group determined by the cost determination unit 24 (FIG. 2B/STEP10). Specifically, the item information unit 25b of the display data generation unit 25 generates display data in which letters, numbers, or symbols represent item information including the names of items, the numbers of items, and the manufacturing conditions of each item. In addition, the cost unit 25c of the display data generation unit 25 generates display data representing the manufacturing cost of the item group.

Next, the communication unit 29 transmits the display data, which is generated by the display data generation unit 25, and the display data, which is generated by the display data generation unit 25 and in the display mode determined by the display mode determination unit 28, to the information terminal 1 (FIG. 2B/STEP11). Specifically, the display data indicating the model of item, which is generated by the item model unit 25a and in the mode determined by the display mode determination unit 28, and the display data, which includes the item letter section and the letters generated by the cost unit 25c, are transmitted to the information terminal 1.

Subsequently, the information terminal 1 forms an image based on the received data and displays the display data on the output unit 12 (FIG. 2B/STEP12).

Note that the manufacturing condition acquisition unit 23 of the design assistance device 2 determines whether the manufacturing conditions are changed after the transmission of the display data to the information terminal 1 (FIG. 2B/STEP13). The manufacturing condition acquisition unit 23 acquires the change in the manufacturing conditions based on, for example, designation from the user. Here, the manufacturing condition acquisition unit 23 determines that the manufacturing conditions are changed when the manufacturing conditions acquired by the manufacturing condition acquisition unit 23 and the designation of the manufacturing conditions from the user are different.

When it is determined that the manufacturing conditions are changed, the cost determination unit 24 determines the manufacturing cost of the item group based on the changed manufacturing conditions (returns to STEP09). The display data generation unit 25 then generates the display data again and transmits the display data to the information terminal 1 to display the display data in the information terminal 1. On the other hand, when it is determined that the manufacturing conditions are not changed, the design assistance device 2 ends the design assistance action.

Next, actions of the display data generation unit 25, the display condition reception unit 26, the observation direction defining unit 27, and the display mode determination unit 28 will be shown and described in detail with reference to FIGS. 4 to 10. In the case described below, the user has selected "PROJECT 2: EJECTOR PIN SET B" by operating the input unit 11 according to the screen shown in FIG. 3.

FIG. 4 is a diagram showing a display example of the information terminal 1 in STEP12 of FIG. 2B when the designation of the display condition is not acquired (for example, just after reading of three-dimensional data). First, an image showing the display data generated by the display data generation unit 25 will be described. The display data generated by the display data generation unit 25 is displayed in a model display section 12b, an item group information display section 12c, an item information display section 12d, and a cost display section 12e of the output unit 12 of the information terminal 1 as shown in FIG. 4.

The model display section 12b corresponds to the data generated by the item model unit 25a of the display data generation unit 25. In addition, the item group information display section 12c and the item information display section 12d correspond to the data generated by the item information unit 25b, and the cost display section 12e corresponds to the data generated by the cost unit 25c.

Next, in the example shown in FIG. 4, the ejector pin set B is an item group A as a target of design assistance including two ejector pins P1, one ejector pin P2, and one ejector pin P3. In addition, each of the ejector pins P1 to P3 is equivalent to the item. That is, the item group A includes the ejector pins (hereinafter, simply referred to as pins) P1 to P3 including a total of four items of three types.

In the present embodiment, each of the pins P1 to P3 includes a cylindrical flange portion and a cylindrical shank portion, and the lengths of the shank portions are different from each other as shown in FIG. 4. In addition, the pin P2 is placed between the two pins P1, and the pins P1 and P2 are aligned in a direction perpendicular to the extension direction of the shank portions. In addition, the pin P3 is separated from the pins P1 and P2 above the pins P1 and P2 and is arranged so that the extension direction of the shank portion is different. Note that in the present embodiment, the extension direction of the shank of the pin p3 is the same direction as the alignment direction of the pins P1 and P2.

Next, the model display section 12b will be described. FIG. 4 is a display example of the display data indicating the shape and the specification information of each of the pins P1 to P3 as well as the relative positions and the relative orientations between the pins P1 to P3 when the item group A is viewed in an entire observation direction D0. In the case described below, the specification information of the pins P1 to P3 displayed in the model display section 12b, that is, the specification information of the pins P1 to P3 generated by the item model unit 25a, provides the dimensions of the P1 to P3.

First, when the designation of the display condition is not acquired, the display data generation unit 25 sets the entire observation direction D0 of the item group A as the initial observation direction in generating the data and generates the display data based on the entire observation direction D0. Therefore, the example shown in FIG. 4 corresponds to a model of the item group A as viewed (projected) in the entire observation direction D0 defined by the observation direction defining unit 27 to clearly display the entire item group A.

Note that the observation direction defining unit 27 can set, for example, an observation direction with the least overlap section between the pins P1 to P3 (between solids) as the entire observation direction D0.

In addition, the observation direction defining unit 27 may, for example, weight each of the pins P1 to P3 and define the entire observation direction based on this. Specifically, the acquired three-dimensional data may include weighting factors related to the pins P1 to P3. The observation direction defining unit 27 may then define the individual observation direction regarding the pin with the largest weight among the pins P1 to P3 as the entire observation direction. In addition, the observation direction defining unit 27 may, for example, define the individual observation direction of the item with the largest value of (observation area of each of the pins P1 to P3)×(weighting factor) as the entire observation direction.

Note that the item model unit 25a uses the three-dimensional data to model the pins P1 to P3 at the time of the completion of the assembly of the item group A, such as when the pins P1 to P3 are included in a mold. Therefore, the display data generated by the item model unit 25a indicates, for example, the orientation and the placement of the pins P1 to P3 at the time of the assembly, and the model display section 12b displays an image based on the display data. The placement relationship between the pins P1 to P3 at the time of the assembly is also clearly displayed when the observation direction is changed as described later.

Next, the item group information display section 12c includes, for example, sections for displaying the name of item group, the names of items, and the numbers of items by using letters and the like as shown in FIG. 4. The item group information display section 12c in the present embodiment also includes selection reception sections 12c1 as sections (for example, check boxes) for receiving selection of the items (pins P1 to P3). The selection of the selection reception sections 12c1 by the user corresponds to the reception of the designation of the items based on the display conditions acquired by the display condition reception unit 26.

Next, the item information display section 12d includes a display section indicating detailed information of each item. For example, the item information display section 12d uses letters and the like to display the material, the hardness, the surface treatment, and the like of each item regarding the manufacturing conditions acquired by the manufacturing condition acquisition unit 23. The item information display section 12*d* also includes a selection reception section 12*d*1 as a section (for example, selection box) for receiving the selection of the manufacturing conditions of each item. The selection of the selection reception section 12*d*1 by the user corresponds to the acquisition of the manufacturing conditions of the items acquired by the manufacturing condition acquisition unit 23.

Next, the cost display section 12*e* is a section for displaying the price and the delivery date of the item group in the present embodiment. As shown in FIG. 4, the cost display section 12*e* uses letters and the like to display the information regarding the manufacturing cost determined by the cost determination unit 24.

Next, the individual observation directions defined by the observation direction defining unit 27 and the display data indicating the models of the item group A generated by the display data generation unit 25 in the individual observation directions will be described with reference to FIGS. 5 to 8.

FIG. 5 is a diagram schematically showing individual observation directions of the pin P1 defined by the observation direction defining unit 27. Note that FIG. 5 is an enlarged view of the model display section 12*b* of FIG. 4. In the present embodiment, the observation direction defining unit 27 defines three individual observation directions D1*a*, D1*b*, and D1*c* as individual observation directions regarding the pin P1 as shown in FIG. 5. For example, each of the individual observation directions D1*a* to D1*c* is defined as an observation direction in which the shapes of the solids (flange portion and shank portion here) of the pin P1 are most clearly observed.

For example, the individual observation direction D1*a* is a direction defined as an observation direction in which the diameter of the flange portion of the pin P1 is most clearly observed, and the individual observation direction D1*c* is a direction defined as an observation direction in which the diameter of the shank portion of the pin P1 is most clearly observed. In addition, the individual observation direction D1*b* is a direction defined as an observation direction in which the shapes of the flange portion and the shank portion of the pin P1 in the extension direction (side) are most clearly observed. Note that the three individual observation directions D1*a* to D1*c* of the pin P1 as a whole will be referred to as an individual observation direction group D1 in some cases.

Figure 6:
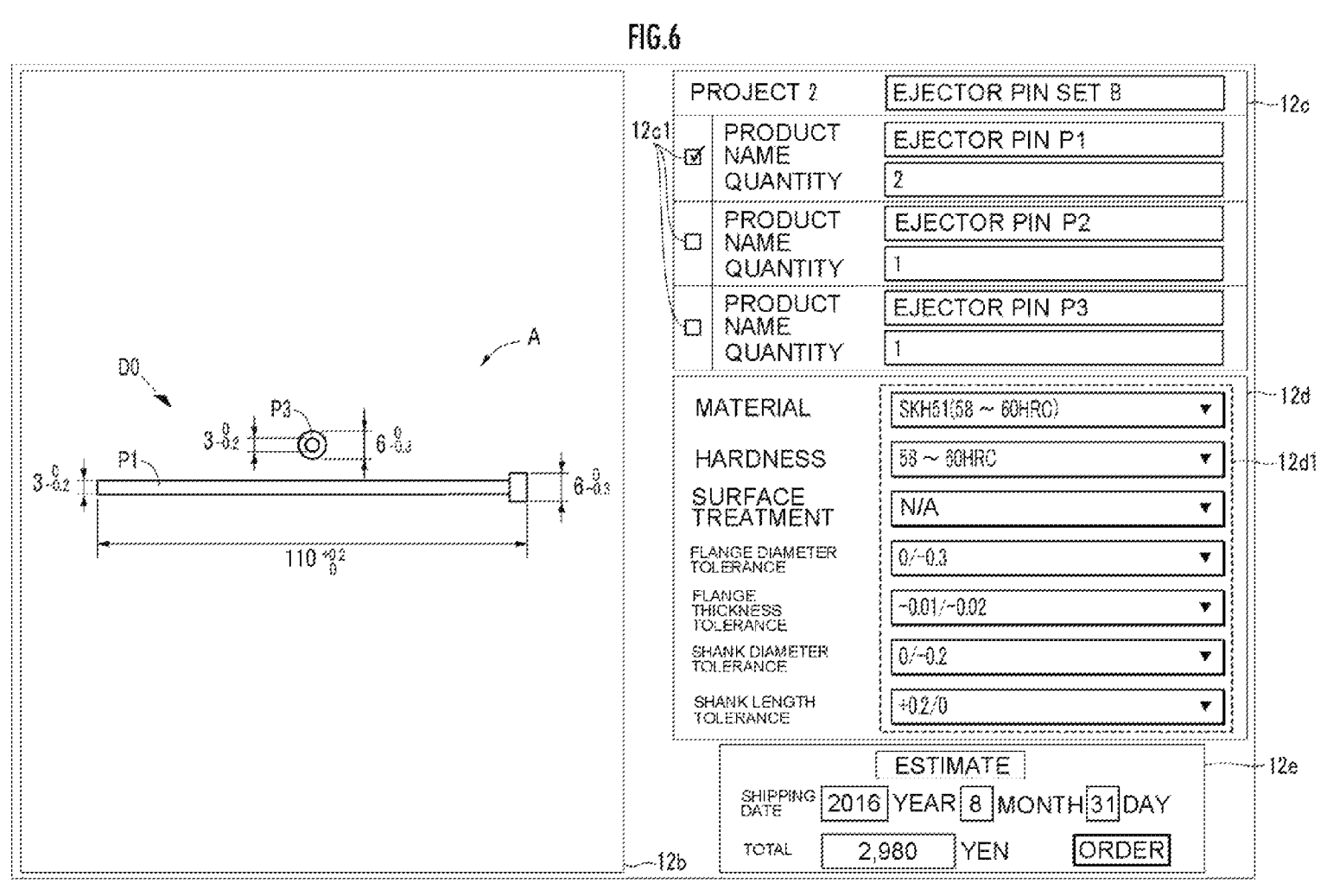

FIG. 6 is a diagram showing a display example in the information terminal 1 displaying the display data generated by the display data generation unit 25 when the pin P1 is selected. As shown in FIG. 6, the pin P1 is selected by the check box of the selection reception section 12*c*1 of the item group information display section 12*c*. FIG. 6 corresponds to a display example of the model display section 12*b* when the pin P1 is selected for the display conditions in generating the display data.

FIG. 6 is also a display example of the model of the item group A as viewed in the individual observation direction D1*b* in FIG. 5. In other words, FIG. 6 corresponds to a case of displaying the display data indicating the shape and the dimension of each of the pins P1 to P3 as well as the relative positions and the relative orientations between the pins P1 to P3 when the display data generation unit 25 views the item group A in the individual observation direction D1*b*. Note that for the understanding of the observation directions, the entire observation direction D0 of the item group A is shown in FIG. 6.

Figure 7:
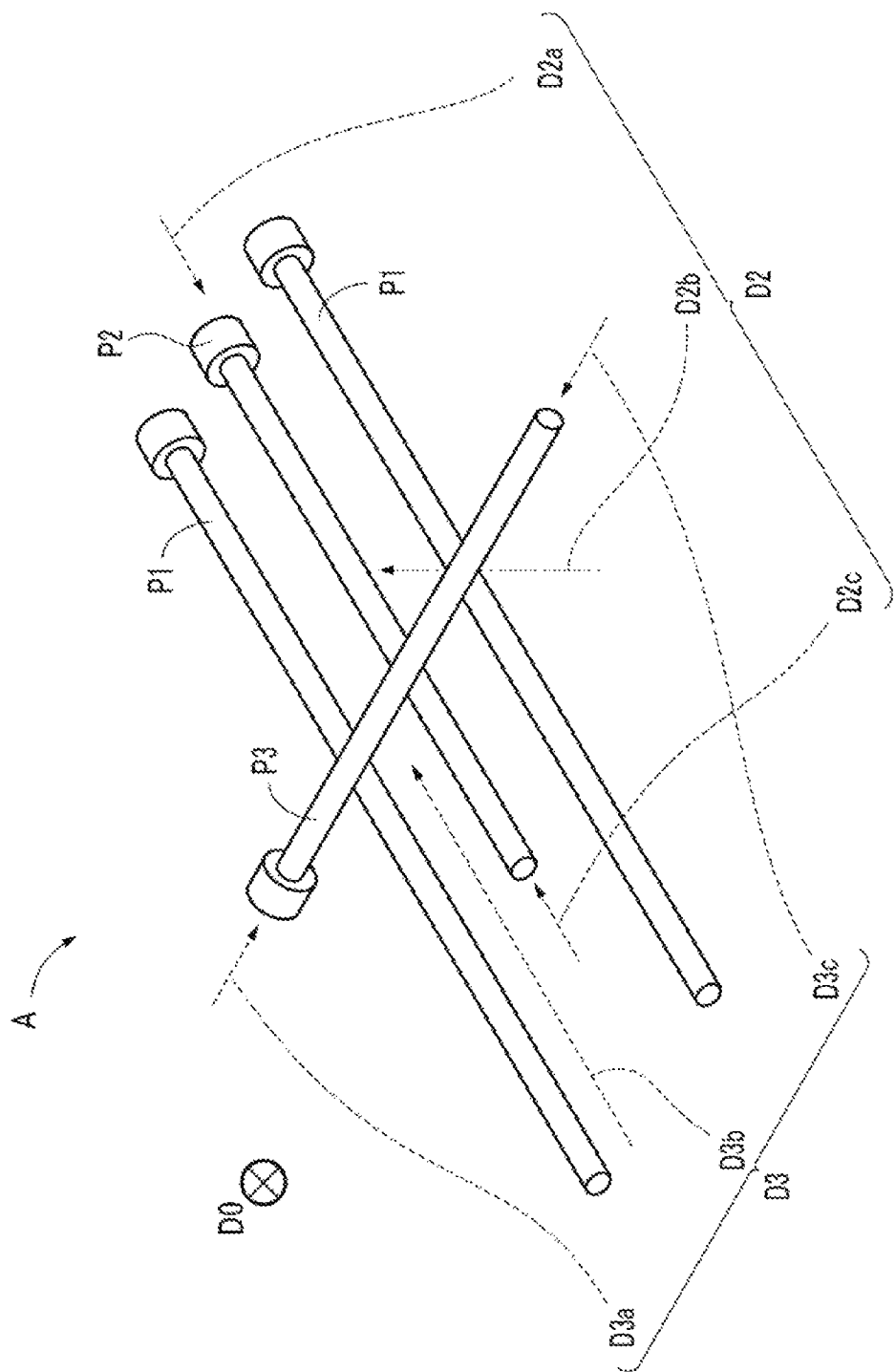
FIG. 7 is a diagram schematically showing individual observation directions defined by the observation direction defining unit of the server in the design assistance system according to the embodiment of the present invention.

FIG. 7 is a diagram schematically showing the individual observation directions of the pins P2 and P3 defined by the observation direction defining unit 27. Note that FIG. 7 is an enlarged view of the model display section 12*b* of FIG. 4 as in FIG. 5. As shown in FIG. 7, the observation direction defining unit 27 defines individual observation directions D2*a*, D2*b*, and D2*c* (individual observation direction group D2) regarding the pin P2 and individual observation directions D1*a*, D3*b*, and D3*c* (individual observation direction group D3) regarding the pin P3.

Figure 8:
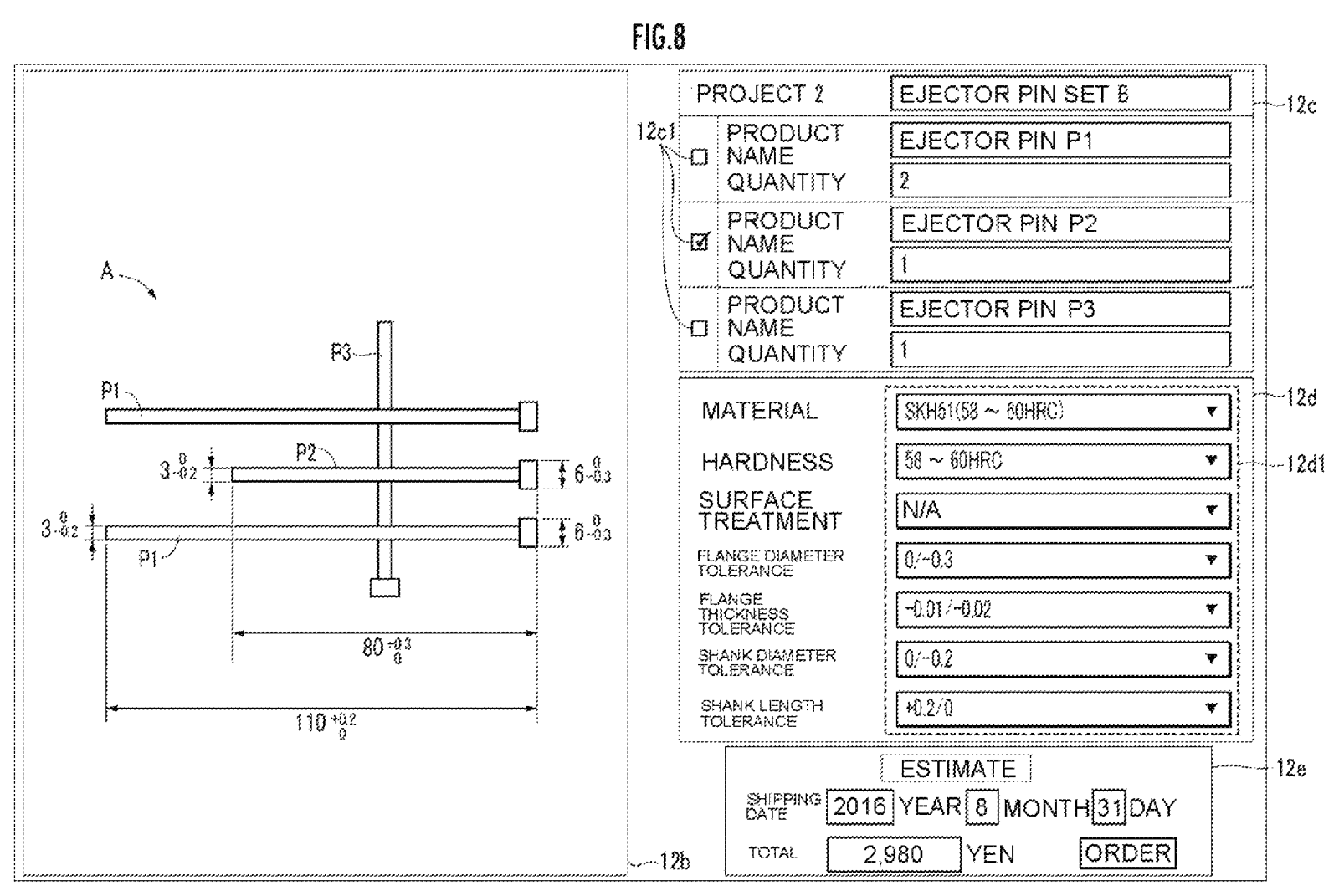

FIG. 8 is a diagram showing a display example in the information terminal 1 displaying the display data generated by the display data generation unit 25 when the pin P2 is selected. As shown in FIG. 8, the pin P2 is selected by the check box of the selection reception section 12*c*1 of the item group information display section 12*c*. FIG. 8 corresponds to a display example of the model display section 12*b* when the pin P2 is selected for the display conditions in generating the display data.

FIG. 8 is also a display example of the model of the item group A as viewed in the individual observation direction D2*b* in FIG. 7. The individual observation direction D2*b* corresponds to an observation direction in which the shapes of the flange portion and the shank portion of the pin P2 in the extension direction are most clearly observed.

Note that the observation direction defining unit 27 may define the individual observation direction based on a weighting factor of each item when the user does not designate an item. The observation direction defining unit 27 or the display data generation unit 25 may also select the observation direction in generating the display data based on the weighting factor of each item.

Specifically, the observation direction defining unit 27 may weight each item by, for example, scoring each item in descending order of strictness in dimensional tolerance, in descending order of manufacturing cost (price or delivery date), in descending order of the number of solids in the item, or the like.

The observation direction defining unit 27 may also define that the individual observation direction of a specific item is an observation direction with the least overlap section between the item and another item. The observation direction defining unit 27 may also define the individual observation direction of a specific item is an observation direction in which the dimension of the item can be most clearly displayed (for example, a direction in which the intervals between the display positions are the largest or a direction in which the end of the extension line can most clearly indicate the end of the solid).

Figure 9:
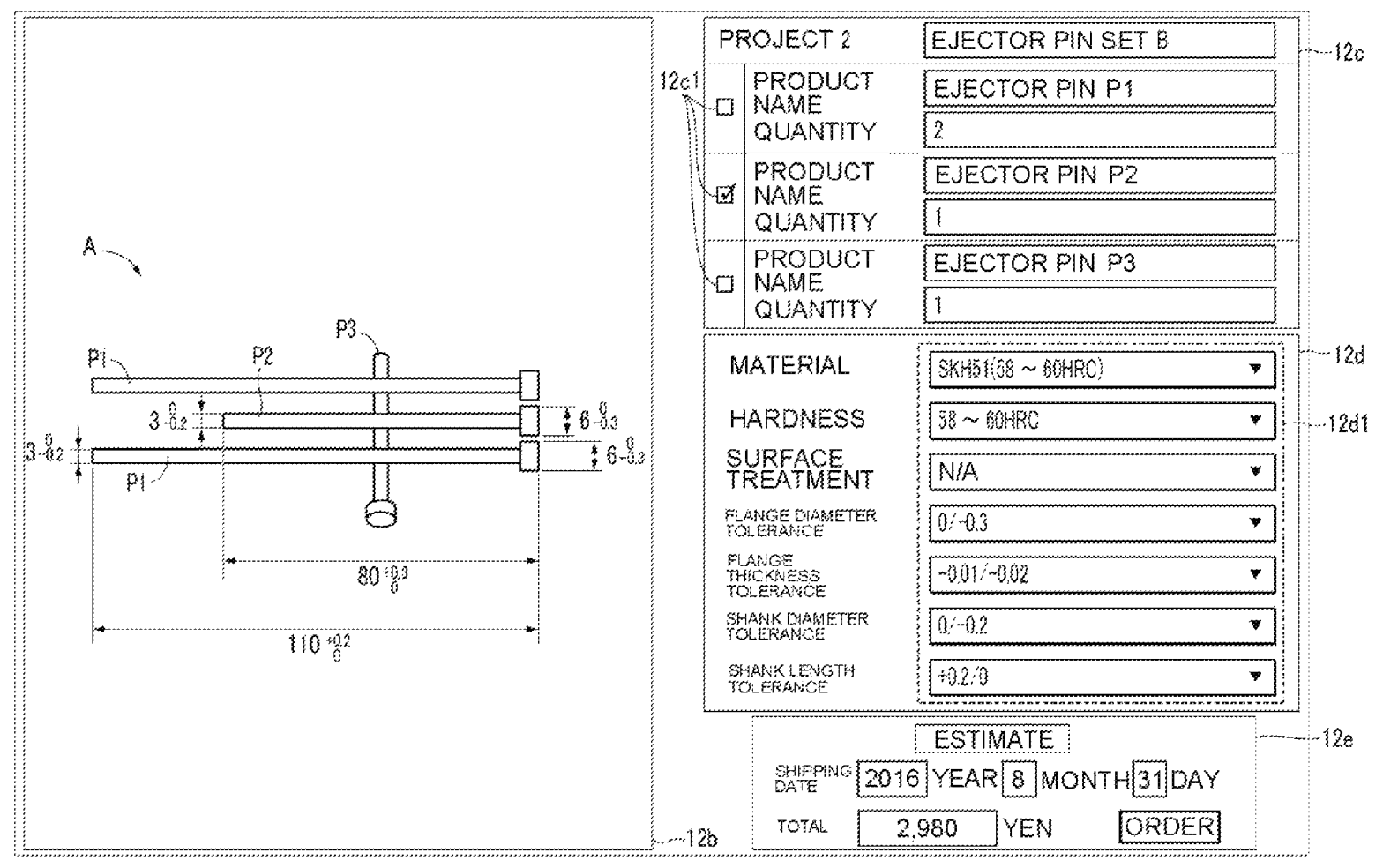

FIG. 9 is a diagram showing a display example in the information terminal 1 displaying the display data generated by the display data generation unit 25 and the display mode determination unit 28 when the observation direction is designated as a display condition. FIG. 9 is a diagram showing a model of the item group A when the observation direction of the item group A is rotated from the observation direction (individual observation direction D2*b*) shown in FIG. 8.

The display condition reception unit 26 receives designation of the observation direction of the item group A for the generation of the display data generated by the display data generation unit 25. For example, when the user refers to the model display section 12*b* to perform an operation of rotating the model of the item group A through the input unit 11, the display condition reception unit 26 determines that the designation of the observation direction is received as a display condition. The display data generation unit 25 sets an arbitrary direction designated by the user as the observation direction and generates display data including two-dimensional display representing the appearance of the item group A and the dimension of each of the pins P1 to P3 in the designated observation direction.

FIG. 9 is a display example of the display data based on the designated observation direction. In the present embodiment, the display mode determination unit 28 adjusts the display of the dimension of each of the pins P1 to P3 based on the shape of each of the pins P1 to P3 as well as the relative positions and the relative orientations between the pins P1 to P3 as viewed in the designated observation direction.

FIG. 10 is an enlarged view of the model display section 12b shown in FIG. 9. FIG. 10 is a diagram showing the display data in which the display positions of the dimensions are determined by the display mode determination unit 28. In the present embodiment, the display mode determination unit 28 determines the display positions of the dimensions of the pins P1 to P3 so that the display position of the dimension of one pin P1 is separated by equal to or more than a predetermined interval from the display positions of the dimensions of the other pins P2 and P3.

First, dimension display sections in the pins P1 to P3 shown in FIG. 10 will be described. The dimension display sections of the flange portion of the pin P1 include a dimension value display section V1a, a dimension line display section L1a, and an extension line display section E1a. In addition, the dimension display sections of the full length of the pin P1 include a dimension value display section V1b, a dimension line display section Lib, and an extension line display section E1b. Similarly, the dimension display sections of the flange portion of the pin P2 include a dimension value display section V2a, a dimension line display section L2a, and an extension line display section E2a. In addition, the dimension display sections of the full length of the pin P2 include a dimension value display section V2b, a dimension line display section L2b, and an extension line display section E2b.

Next, as shown in FIG. 10, the dimension value display section V1a of the flange portion of the pin P1 is moved away from the dimension value display section V2a of the flange portion of the pin P2. In addition, the dimension value display section V1b of the full length of the pin P1 is moved away from the dimension value display section V2b of the full length of the pin P2. Specifically, the display mode determination unit 28 determines the positions of the dimension lines in each of the items (pins P1 to P3) to determine the display positions of the dimensions of each item. Therefore, the positions of each dimension value display section and the like can be easily viewed.

Note that the display mode determination unit 28 not only determines the display positions of the dimensions, but also determines to exclude the display of part of the dimensions. The display mode determination unit 28 excludes the display of at least part of the dimensions (specification information) of the items to determine the display mode of the dimension of each item. For example, the display mode determination unit 28 excludes the display of the dimension of at least one item with a low weight among the items. For example, as shown in FIGS. 9 and 10, the display mode determination unit 28 excludes the dimension display of the pin P3 in the model display section 12b.

The display mode determination unit 28 may also determine the display mode of the display data to indicate only an outline of the item for which the display of the dimension is excluded. For example, the item for which the display of the dimension is excluded is an item with a low weight in the item group, and therefore, the item may be more unclear than the other items. Therefore, the item for which the dimension display is excluded can be indicated only by the outline to clarify the display of an item including a section overlapping with the item, and the display of the model becomes clear.

Although not shown, the display mode determination unit 28 may also determine (select) the display size, the display color, the font, and the like for the display of each dimension. For example, the display mode determination unit 28 may determine the display mode of each dimension so that the display size of the dimension value of the pin P1 becomes greater than the display size of the dimension value of the pin P2. The display mode determination unit 28 may also determine the display mode of each dimension so that the display color of the dimension value of the pin P1 is different from the display color of the dimension value of the pin P2.

In this way, the design assistance device 2 in the present embodiment includes: the display data generation unit 25 that generates two-dimensional display data including two-dimensional display representing an appearance of an item group and specification information of at least one of a plurality of items in one observation direction in acquired three-dimensional data; and the display mode determination unit 28 that determines a display mode of the specification information of each of the plurality of items in the two-dimensional display based on a shape of each of the plurality of items as well as relative positions and relative orientations between the items in the one observation direction.

Therefore, in the two-dimensional display of a three-dimensional model of the item group, the appearance of the item group and the specification information of each item can be displayed so that the user can easily view the item, and beneficial design assistance information can be indicated to the user.

The design assistance device 2 further includes the display condition reception unit 26 that receives designation of another observation direction different form the one observation direction of the item group. The display data generation unit 25 then generates two-dimensional display data including two-dimensional display representing an appearance of the item group and specification information of each of the plurality of items in the other observation direction received by the display condition reception unit 26, and the display mode determination unit 28 determines a display mode of the specification information based on the two-dimensional display data.

Therefore, even when the user designates an arbitrary observation direction, the design assistance device 2 can follow the designation to generate the display data again and adjust the display mode of the display data. Therefore, clear specification information can be displayed in any observation direction.

The display mode determination unit 28 also determines display positions of the specification information in the two-dimensional display data so that the display position of the specification information of one of the plurality of items is separated by equal to or more than a predetermined interval from the display position of the specification information of another item as viewed in the other observation direction. Therefore, the display of the specification information of each item can be clearly distinguished.

In addition, the specification information is a dimension of each of the plurality of items, and the display mode determination unit determines a position of a dimension line of each of the plurality of items to determine a display position of the dimension in the two-dimensional display. Therefore, the dimension of each item can be clearly displayed.

The display mode determination unit 28 further determines to exclude the display of the specification information of at least one of the plurality of items in the two-dimensional display of the display data generated by the display data generation unit 25. Therefore, for example, the specification display of an unimportant item or an item with a large overlap section can be deleted (excluded) to improve the clarity of the display of each item.

In addition, the information terminal 1 and the design assistance device 2 can be combined to provide the design assistance system S that can clearly display the items for the user. The design assistance system S also functions as an automatic estimation system that clearly displays the items for the user to determine the cost. The design assistance device 2 also functions as an automatic estimation device that clearly displays the items for the user to determine the cost.

Note that in the case described in the present embodiment, the design assistance device 2 functions as a server with the information terminal 1 as a client. The design assistance device 2 can function as a server that provides the design assistance information to a plurality of information terminals at the same time. In addition, the design assistance device 2 may perform not only the design assistance for the information terminal 1, but may also acquire three-dimensional data from the information terminal 1 to provide design assistance information to another terminal, or may acquire three-dimensional data from another terminal to provide design assistance information to the information terminal 1.

That is, to provide the design assistance information to an external terminal, the design assistance device 2 just needs to include the communication unit 29 that transmits the display data generated by the display data generation unit 25 or the display mode determination unit 28 to the outside. Note that the communication unit 29 may transmit the design assistance information to the manufacturer as an external terminal. This allows to directly order the designed item group from the manufacturer. Note that, for example, "ORDER" shown in FIG. 9 can be selected to place an order to the manufacturer.

The present invention also allows to use, for example, a general information processing device to carry out the design assistance method of the present embodiment through each of the processing steps. That is, each of the processing steps can also be realized as a design assistance method. For example, beneficial design assistance can be performed by clearly displaying the items through at least STEPS01, 03, 04, and 12 of the steps shown in FIGS. 2A and 2B.

Note that in the present embodiment, the configuration of the design assistance device 2 is just an example. For example, when the cost is not to be determined, the manufacturing condition acquisition unit 23 and the cost determination unit 24 may not be provided. In addition, the display condition reception unit 26, the observation direction defining unit 27, and the basic information storage unit DB may be provided outside of the design assistance device 2. In addition, the display mode determination unit 28 may not have the determination function of excluding the display of the specification information.

REFERENCE SIGNS LIST

1 Information terminal (client)
2 Information assistance device (server)
21 Three-dimensional data acquisition unit
22 Item recognition unit
25 Display data generation unit
26 Display condition reception unit
27 Observation direction defining unit
28 Display mode determination unit
S Design assistance system

The invention claimed is:
1. A design assistance device comprising:
a CPU, wherein
the CPU is configured to acquire three-dimensional data of an item group including a plurality of items;
the CPU is configured to generate two-dimensional display data including two-dimensional display representing an appearance of the item group and specification information of at least one of the plurality of items in one observation direction in the three-dimensional data;
the CPU is configured to determine a display mode of the specification information of each of the plurality of items in the two-dimensional display based on a shape of each of the plurality of items as well as relative positions and relative orientations between the plurality of items as viewed in the one observation direction; and
when designation of a display condition is received to provide a designated display condition that is different from an initial display condition in such a way that a display orientation of the specification information is tilted by an amount equal to or more than a predetermined amount according to the designated display condition, the CPU is configured to determine to change the display orientation of the specification information from an initial display orientation.

2. The design assistance device according to claim 1, wherein,
the CPU is configured to receive designation of another observation direction different from the one observation direction of the item group,
the CPU is configured to generate two-dimensional display data including two-dimensional display representing an appearance of the item group and specification information of the at least one item in the other observation direction, and
the CPU is configured to determine a display mode of the specification information of each of the plurality of items in the two-dimensional display based on a shape of each of the plurality of items as well as relative positions and relative orientations between the plurality of items as viewed in the other observation direction.

3. The design assistance device according to claim 1, wherein
the CPU is configured to determine a display position of the specification information of each of the plurality of items in the two-dimensional display so that a display position of the specification information of one of the plurality of items is separated by equal to or more than a predetermined interval from a display position of the specification information of another item.

4. The design assistance device according to claim 1, wherein
the specification information is a dimension of each of the plurality of items, and
the CPU is configured to determine a position of a dimension line of each of the plurality of items to determine a display position of the dimension of each of the plurality of items in the two-dimensional display.

5. The design assistance device according to claim 1, wherein
the CPU is configured to determine to exclude the display of the specification information of at least one of the plurality of items in the two-dimensional display.

6. The design assistance device according to claim 1, wherein,
the CPU is configured to acquire a manufacturing condition that can be selected in manufacturing each of the plurality of items; and
the CPU is configured to determine a manufacturing cost of the item group corresponding to the manufacturing condition.

7. The design assistance device according to claim 1, wherein,
the CPU is configured to transmit the two-dimensional display data to outside.

8. The design assistance device according to claim 1, wherein, the CPU is configured to exclude the display of the specification information of at least one item with a low weight.

9. The design assistance device according to claim 1, wherein, the CPU is configured to change, when an item is selected from the plurality of items, an observation direction regarding the selected item and the display orientation of the specification information according to the selected item.

10. The design assistance device according to claim 1, wherein the specification information includes a dimension value.

11. A design assistance system comprising:
the design assistance device according to claim 1; and
an information terminal including an input unit inputting the three-dimensional data and an output unit displaying the two-dimensional display data.

12. A server comprising:
a CPU, wherein,
the CPU is configured to acquire three-dimensional data of an item group including a plurality of items through an information terminal;
the CPU is configured to generate two-dimensional display data including two-dimensional display representing an appearance of the item group and specification information of at least one of the plurality of items in one observation direction in the three-dimensional data;
the CPU is configured to determine a display mode of the specification information of each of the plurality of items in the two-dimensional display based on a shape of each of the plurality of items as well as relative positions and relative orientations between the plurality of items as viewed in the one observation direction;
the CPU is configured to transmit the two-dimensional display data to the information terminal, and
when designation of a display condition is received to provide a designated display condition that is different from an initial display condition in such a way that a display orientation of the specification information is tilted by an amount equal to or more than a predetermined amount according to the designated display condition, the CPU is configured to determine to change the display orientation of the specification information from an initial display orientation.

13. The server according to claim 12, wherein, the CPU is configured to exclude the display of the specification information of at least one item with a low weight.

14. The server according to claim 12, wherein, the CPU is configured to change, when an item is selected from the plurality of items, an observation direction regarding the selected item and the display orientation of the specification information according to the selected item.

15. A method for performing design assistance comprising the steps of:
acquiring three-dimensional data of an item group including a plurality of items;
generating two-dimensional display data including two-dimensional display representing an appearance of the item group and specification information of at least one of the plurality of items in one observation direction in the three-dimensional data;
determining a display mode of the specification information of each of the plurality of items in the two-dimensional display based on a shape of each of the plurality of items as well as relative positions and relative orientations between the plurality of items as viewed in the one observation direction; and
when designation of a display condition is received to provide a designated display condition that is different from an initial display condition in such a way that the display orientation of the specification information is tilted by an amount equal to or more than a predetermined amount according to the designated display condition, determining to change the display orientation of the specification information.

16. The method for performing design assistance according to claim 15 further comprising the step of:
excluding the display of the specification information of at least one item with a low weight.

17. The method for performing design assistance according to claim 15 further comprising the step of:
when an item is selected from the plurality of items, changing an observation direction regarding the selected item and the display orientation of the specification information according to the selected item.

* * * * *